United States Patent
Sachdev et al.

(12) 
(10) Patent No.: US 6,503,874 B2
(45) Date of Patent: Jan. 7, 2003

(54) CLEANING METHOD TO REMOVE FLUX RESIDUE IN ELECTRONIC ASSEMBLY

(75) Inventors: Krishna G. Sachdev, Hopewell Junction, NY (US); Chon C. Lei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/760,939

(22) Filed: Jan. 16, 2001

(65) Prior Publication Data

US 2002/0094940 A1 Jul. 18, 2002

(51) Int. Cl.⁷ .................................. B08B 7/00
(52) U.S. Cl. ..................... 510/177; 510/175; 510/506; 134/1.3; 134/3; 134/10; 134/38; 134/40; 134/42
(58) Field of Search .............. 134/1.3, 10, 3, 134/38, 40, 42; 510/163, 412, 175, 506, 177

(56) References Cited

U.S. PATENT DOCUMENTS

| 5,035,826 | A | | 7/1991 | Durbut et al. |
|---|---|---|---|---|
| 5,330,582 | A | * | 7/1994 | Chihara et al. |
| 5,437,808 | A | | 8/1995 | Weltman et al. |
| 5,486,314 | A | * | 1/1996 | Wack et al. |
| 5,610,132 | A | | 3/1997 | Momoda et al. |
| 5,786,319 | A | | 7/1998 | Pedersen et al. |
| 5,854,187 | A | | 12/1998 | Blum et al. |
| 5,891,392 | A | | 4/1999 | Monticello et al. |
| 5,891,836 | A | | 4/1999 | Kacher |
| 5,938,856 | A | * | 8/1999 | Sachdev et al. |

* cited by examiner

*Primary Examiner*—Gregory E Webb
(74) *Attorney, Agent, or Firm*—DeLio & Peterson LLC; John J. Tomaszewski; James J. Cioffi

(57) ABSTRACT

This invention provides a method for removing flux residue and similar other residues formed on the surfaces of micro electronic components during soldering operations using solder paste and fluxing agents in electronic module assembly component fabrication by a semi-aqueous solvent cleaning process using propylene glycol alkyl ether solvents, preferably the mono alkyl ethers, as replacements for xylene. The electronic components may contain plastic components, for example, a plastic grid array (PBGA) in addition to silicon device chip(s), C4 decaps and SMTs on a ceramic chip carrier with solder columns. Preferred solvents are dipropylene glycol mono methyl ether and tripropylene glycol mono methyl ether, which are both water soluble.

6 Claims, No Drawings

CLEANING METHOD TO REMOVE FLUX RESIDUE IN ELECTRONIC ASSEMBLY

BACKGROUND OF THE INVENTION

1. Field of the Invention

The present invention relates generally to a method for removing flux residue and other surface contaminants formed on the surfaces of microelectronic components during soldering operations using solder paste in electronic module assembly, and, more particularly, to a semi-aqueous solvent cleaning process for removing flux residues that are formed on a chip, substrate, card or other electronic component containing plastic components.

2. Description of Related Art

Semiconductor devices are becoming smaller and more dense with the evolution of new technology. However, increases in circuit density produce a corresponding increase in overall device enhancements and semiconductor manufacturers are therefore constantly challenged to improve the quality, design and other aspects of their products. Some electronic modules carry silicon device chip, surface mount components (SMT) as well as plastic components like plastic ball grid array module (PBGA) on a ceramic chip carrier. For those type components special consideration is required for the assembly fabrication procedures and cleaning methods to remove flux residues formed during solder connections to assure cleaning solvent and process compatibility with all the module materials including plastic components.

Assembly fabrication processes for electronic circuit devices typically use solder connections for electrically joining an electronic device to a support substrate, solder ball and solder column attachment to chip carrier, for ceramic ball grid array (CBGA) and ceramic column grid array (CCGA) connections to organic board or a printed circuit board (PCB), and to attach other SMT components to a PCB.

C4 technology (controlled collapse chip connection), also called flip-chip bonding, is used for example to attach a semiconductor chip to a ceramic substrate. This bonding method involves connecting an array of solder bumps on the chip circuit structure side to C4 bonding pads on the substrate by high temperature solder reflow in a furnace under $N_2$ or forming gas (5% $H_2$ with 95% $N_2$), typically requiring reflow temperature of 350–365° C. for the 97/3 Pb/Sn alloy in the presence of a rosinbased Alpha 102 solder flux to form a solder bond. The flux residue formed in the C4 joining process is removed in a solvent cleaning process using xylene or chlorinated solvents. Low temperature soldering processes in electronic module assembly operations generally employ low melting alloys or solder paste of which Pb37/Sn63 eutectic paste is widely used. For example, eutectic solder paste is used to attach 90/10 Pb/Sn solder balls and solder columns to a ceramic chip carrier in a ceramic ball grid array (CBGA) and ceramic column grid array (CCGA), to attach solder balls to a plastic chip carrier in a plastic ball grid array (PBGA), to attach PBGA and other plastic components to a ceramic chip carrier, to join surface mount components as capacitors/resistors to a chip carrier, and for mounting of electronic components onto PCBs.

Solder pastes typically comprise a solder powder, for example, eutectic Sn-Pb alloy (Pb37%-Sn63%), melting temperature about 183° C., eutectic Bi-Sn alloy, melting temperature about 135° C., ternary alloy Bi-Sn-Pb and Sn-In along with other additives for wettability, flow properties, and compatibility with screen printing or dispensing methods. Various types of pastes that are used in soldering processes in electronics assembly include: water soluble solder paste flux formulations, no-clean (NC) flux pastes, and non-water soluble paste compositions. The fluxing agents generally used in solder pastes are, organic acids or salts, fatty acids or esters, polycarboxylic acids and derivatives, hydroxy carboxylic acids, organic acid esters, rosin acid and ester compositions, typically abietic acid and its derivatives, and in some cases amines including alkanolamines, aliphatic amines, and aromatic amines.

The presence of flux in solder pastes used for solder connections, for example, in the fabrication of BGA, CBGA, CCGA, SMT discretes, and solder ball and column attachment to a chip carrier for package-to-organic board connections, provides surface wettability of the contacting surfaces during joining which is essential for solder bond integrity.

In the cooling cycle of the thermal profile for joining, the solder hardens and at the same time, vaporized residual flux and its decomposition products deposit on the various exposed surfaces. In a subsequent step, the electronic assembly is then subjected to a solvent cleaning operation to remove flux residue prior to further processing.

The flux residue must be removed from all critical surfaces prior to further operation since it can cause function failure during long term use due to, for example, stress corrosion during exposure to temperature and humidity environment. It is therefore necessary after chip joining and other soldering processes during fabrication of electronic circuit assemblies, that the flux residue be cleaned off (removed) before subsequent operations.

Rosin fluxes are natural products comprising a complex mixture of cyclic hydrocarbon acid fractions which form almost 90% of the rosin flux chemical composition and about 10% neutral fraction constituting their corresponding methyl esters, alcohols, acetate and decarboxylated products. Among the rosin acids which are the major components of the mixture, abietic acid is present up to between about 50 to about 60 percent, dihydroabietic acid about 14%, and tetrahydroabietic acid and dehydroabietic acid being the minor constituents of the rosin acid mixture. These rosin fluxes and other fluxes are known to promote wetting of metal surfaces by their chemically reacting with an oxide layer on the surface of tin and/or lead providing an oxide-free metal exposed surface of high surface energy which thermodynamically should readily wet clean contacting metal surfaces on the substrate and provide reliable solder interconnection.

In the case of water soluble solder paste flux, residue after a soldering operation is generally removed by aqueous cleaning with water alone or water in conjunction with a suitable surfactant. With solder pastes which contain flux and other organic constituents which are not water soluble, flux residue cleaning processes traditionally have employed halogenated hydrocarbons, such as, perchloroethylene, and aromatic hydrocarbons as xylene similar to the rosin flux residue cleaning with xylene in the C4 chip join process. The halogenated hydrocarbon solvents, however, are undesirable due to their harmful effects on the environment and on human health as stated above.

With xylene there are also safety concerns as it is a highly flammable and volatile solvent having a flash point of 85° F. which requires special high cost equipment for chemical safety in manufacturing environment as well as for compliance with rules for air emissions of hazardous air pollutants. In addition to these problems in the use of xylene, perchloroethylene and related solvents, there is a concern as to their viability as flux residue cleaning solvents in instances where the electronic module or ceramic chip carrier may contain plastic components mounted thereon prior to another soldering operation using solder paste, for example, eutectic solder paste for low temperature reflow process (220° C. peak temperature). For example, fabrication of an electronic module with a 42.5 mm×42.5 mm ceramic chip carrier with solder columns involves (1) C4 chip and C4 decaps attachment using alpha 102 rosin flux with high temperature solder reflow at 360° C. peak temp; (2) flux residue cleaning with xylene; (3) solder joining SMTs and a plastic component (PBGA) with water soluble paste with low temperature solder reflow at 220° C. peak temperature; (4) flux residue cleaning with deionized water; (5) solder column attachment using solder paste with non-water soluble flux component at 220° C. peak temperature solder reflow; and (6) flux residue cleaning. A problem associated with such a module assembly process and other fabrication processes employing plastic components such as a PBGA is that although xylene is an effective cleaning solvent for flux residues from various types of flux compositions used in solder pastes, it may not be a suitable solvent for removing flux residue from the type electronic module described above because of a concern for its effect on the integrity of the plastic component. Deionized $H_2O$ with or without added surfactant compositions are not entirely effective in removing the flux residue from non-water soluble solder pastes. In view of the problems with the use of xylene and related solvents, there is a need for an alternative method of cleaning flux residue to provide an environmentally acceptable cleaning solution to remove flux residues in soldering processes involving the use of solder pastes. Furthermore, the new alternate cleaning method should also be effective in removing flux residue post SMT (surface mount technology) from low temperature reflow operations at 220° C. peak temperature.

Bearing in mind the problems and deficiencies of the prior art, it is therefore an object of the present invention to provide an environmentally safe method for effective removal of flux residue from electronic components following soldering processes using solder paste based on rosin derivatives and other fluxing materials, and particularly to provide a non-hazardous method of removing flux residues formed during solder reflow in electronic component assembly fabrication processes.

It is another object of the present invention to provide an environmentally safe semi-aqueous cleaning method for flux residue cleaning which method can be used to remove flux residues from electronic assemblies including those containing plastic components.

A further object of the invention is to provide a method for cleaning flux residues from electronic assemblies including those containing plastic components using non-hazardous solvents which are free of environmental regulations for chlorinated solvents and for xylene type solvents.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for removing flux residues from electronic modules following soldering operations using solder paste comprising the steps of:

supplying an electronic component which may include a plastic component and having contact pads with screened-on solder paste such as an eutectic solder paste (63%Sn/37%Pb);

placing the component with paste screened side into contact with and aligning with a second component joining regions such as pads;

subjecting the resulting assembly to solder reflow in a furnace at typically a 210° C. peak temperature to melt and thereby relfow the solder regions, and allowing the joined module assembly to cool, e.g., to room temperature;

subjecting the joined module assembly having a flux residue deposit on the module surface to a flux residue cleaning process comprising the steps of, providing a solvent cleaning composition comprising a propylene glycol mono alkylether, preferably a dipropylene glycol alkyl ether—or a tri-propylene glycol alkyl ether, or mixture thereof, wherein the alkyl group is hydrocarbon radical represented by the formula $C_nH_{2n+1}$, where n=1 to 8, preferably 1 to 4;

contacting the module with the cleaning composition at an elevated temperature of for example about 50°–80° C. to about 100°–120° C. or higher for an effective time, usually about 5 min. to 60 min., to soften, swell, dissolve, remove or strip-off the flux residue deposit from the various surfaces of the module assembly; and contacting the cleaned substrate having cleaning solvent carry-over, with water, preferably hot deionized water, e.g., 40 to 80° C. to remove the solvent from the substrate surfaces and preferably followed by a water rinse using pressure spray or immersion with agitation, and drying, for example, by blowing $N_2$ or air and heating at elevated temperature to remove any absorbed water.

In another aspect of the invention, a cleaning composition is provided for removing flux residues, such as residue formed during component joining operations using solder paste, and flux residue deposits such as those formed from the use of rosin and other types of fluxing agents in forming solder connections, from electronic modules which may contain plastic components consisting essentially of, in weight %:

a mono, di- and/or tri-propylene glycol mono alkyl ether wherein the alkyl group is a hydrocarbon radical represented by the formula $C_nH_{2n+1}$ where n=1 to 8, preferably 1 to 4, in an amount of about 30% to about 100%, preferably 50% to 70%; and the balance essentially water.

In another aspect of the invention, the propylene glycol ether may be a di alkyl ether, with the proviso that the propylene glycol composition be water soluble. Preferably the mono ethers are employed but mixtures of mono ethers and di ethers may also be used if the composition is water soluble. The following description will be directed to mono ethers for convenience.

The immersion time for softening/swelling, dissolving, removing or stripping off the flux residue deposit using the method of the invention is typically dependent on the temperature of the cleaning composition whereas at higher temperatures, a lower contact time is generally needed for removal of the flux residue.

DESCRIPTION OF THE PREFERRED EMBODIMENT(S)

This invention generally relates to bond and assembly processes in microelectronics as component attachment involving solder connections using solder paste with organic flux components or using rosin and other type of fluxes, for example in attachment of a semiconductor device to insulative substrate or chip carriers, substrate-to-board interconnections in the fabrication of multi-chip-module (MCM) and single-chip-module (SCM) electronic components, and for devicesubstrate package interconnection to an organic board or a printed circuit board (PCB), and to attach other electronic components onto a PCB.

This invention particularly relates to the removal of flux residues that are formed in soldering processses using solder paste with solder fluxes, such as rosin-based and other types of fluxing agents, under solder reflow conditions. The invention is also concerned with removal of flux residues formed in other types of solder interconnections, such as, for example, electronic package-to-board connections, SMT discretes as resistors/capacitor attachment to substrate, solder joining solder balls and solder columns to substrate in the fabrication of ceramic ball garid array (CBGA) and ceramic column grid array (CCGA), to name a few, which may carry plastic components such as plastic ball grid array (PBGA) in addition to the silicon device chips soldered to a substrate. More particularly, this invention is concerned with a semi-aqueous cleaning method for flux residues formed in soldering operations, with environmentally safe organic solvents having compatibility with plastic components, which solvents are to replace halogenated solvents and aromatic hydrocarbons particularly, perchloroethylene, xylene, and related solvents which have been identified as hazardous air pollutants (HAPs) and which are hazardous to human health and to the environment besides being unsuitable for use to remove flux residue from electronic modules containing plastic components due to concern for possible detriment to plastic components.

In the fabrication of micro electronic devices, soldering processes for interconnections are an integral part of the assembly for electrically joining semiconductor devices to a substrate, and for attachment of solder balls and solder columns to the substrate BSM (back side metal). In the controlled collapse chip connection (C4) or flip-chip technology that employs solder bumps or solder columns on silicon chip circuit side for connecting to ceramic chip carrier, a flux, typically rosin-based Alpha-102 flux, is applied on C4s and solder columns and/or solder wettable metal pads on the substrate prior to assembling/aligning and then the assembly is subjected to solder reflow process in a programmed furnace in oxygen-free ambient of $N_2$ or forming gas (5% $H_2$+95% $N_2$). The peak temperature used in solder reflow profile depends on the Pb/Sn alloy composition used for chip attachment. With 90% Pb/10% Sn, and 97% Pb/3% Sn alloy, peak temperature in the reflow process generally can reach 360° C. With eutectic solder 37Pb/63Sn paste compositions, such as used for BGA join, wire column join, SMT discrete attachment, and seal band attachment, the peak temperature during interconnections typically are between about 210° C. to about 220° C.

Under these solder reflow conditions, the flux promotes wetting of the metal surface necessary to assure metal-metal contact and bonding, and itself undergoes thermally induced chemical changes that lead to formation of volatile species most of which are readily removed during the process. However, some of these reactive species undergo secondary crosslinking reactions resulting in deposition of carbonaceous flux residues on critical surfaces. It is necessary that the flux residue be cleaned prior to subsequent operations as its presence can be detrimental to the electronic device operation due to metal corrosion concerns under temperature-humidity environment causing product reliability problems.

As stated earlier, xylene and chlorinated solvents such as perchloroethylene are commonly used for cleaning flux residues on critical surfaces in the high temperature chip joining process using rosin based flux and in other soldering processes, for example, in eutectic solder reflow at 210° C. peak temperature, using non-water soluble solder paste with various types of fluxing agents.

The inventors have found that flux residues formed in solder connection processes using solder paste and other low temperature solder connections using various types of organic fluxing agents, can be effectively cleaned with propylene glycol mono alkylether or aryl ether and acyl ether solvents, such as propylene glycol mono alkylether, dipropylene glycol- and tripropylene glycol mono alkylethers when used alone or in combination with each other or in combination with water at an elevated temperature and with a later water rinse step.

In particular, it has been found according to this invention, that soldering flux residues can be readily removed from electronic components which may contain plastic component, for example, plastic grid array (PBGA) in addition to silicon device chip(s) and SMTs by exposing the assembly preferably at an elevated temperature, to a propylene glycol alkyl ether or a di- and/or tri-propylene glycol alkyl ether, or a combination thereof, followed by a water rinse step. In an alternate process, the propylene glycol alkyl ether solvents can also be used in an aqueous solution containing about 30% to about 100%, preferably from about 50% to about 70% of one or more of these solvents, the balance being water, preferably deionized water, followed by a water rinse step.

The preferred organic solvents of the invention are the propylene glycol mono alkylether, dipropylene glycol mono alkyl ether and tri-propylene glycol mono alkyl ethers. These solvents may be represented by the formula $R^1O(AO)xR^2$ wherein $R^1$ and $R^2$ are independently selected from the group consisting of hydrogen atoms, aryl and acyl groups and preferably alkyl groups of the formula $C_nH_{2n+1}$ where n=1–8 atoms, preferably 1–4 atoms, A is a straight or branched chain, preferably branched chain $C_3$ alkylene group as —[$CH_2CH(CH_3)$]—, and X is 1 to 3 with the proviso that one of $R^1$ or $R^2$ is hydrogen and the other is an aryl, alkyl or acyl group, preferably an alkyl group of C1–C8, and most preferably C1–C4, e.g., methyl, ethyl, propyl or isopropyl, butyl or isobutyl groups. The aryl group may be phenyl and the acyl group acetyl for example.

As discussed above, di alkyl ethers may be employed if the cleaning composition is water soluble. Preferably the mono alkyl ethers are employed.

Various exemplary solvents that are suitable for use in the stripping compositions to remove residual flux deposits according to this invention include: di(propylene glycol) methyl ether (fp. 75° C.), di(propylene glycol) butyl ether (fp 96° C.), tri(propylene glycol) mono methyl ether (fp.>109° C.), tri(propylene glycol) monobutyl ether (fp>109° C.), and tri(propylene glycol) n-propyl ether. The alkyl group is about C1–C8, preferably C1–C4.

The solvent cleaning composition is used to contact the electronic component and flux residue and cause softening and/or swelling or dissolution of the flux residue resulting in its essentially complete removal from the various surfaces of the substrate. The contacted parts are then preferably subjected to immersion in water, preferably hot deionized water, to wash off the solvent carry-over from the cleaning bath, and then thoroughly rinsed with deionized water by pressurized spray or other means of agitation to remove any residual cleaning solvent off the surface of the substrate followed by drying. Alternately, the contacted parts can be rinsed with a low boiling solvent such as acetone or 2-propanol (IPA) which allows for rapid drying but water rinsing is preferred according to this invention due to the hazards associated with the use of these low boilng volatile solvents of which IPA is classified as a VOC i.e., a volatile organic compound.

In a representative process for flux residue cleaning after solder column attachment to a ceramic chip carrier using solder paste, a ceramic chip carrier or substrate having silicon device chip(s), also referred to as C4 chip, and C4 decaps, and SMTs and in addition carrying a plastic grid array (PBGA) was accomplished by the semi-aqueous cleaning method according to this invention. Typically, the chip carrier assembly after soldering operation is immersed in the solvent cleaning composition of the invention at between about 60° C.–80° C. with mechanical agitation or immersion spray for between about 5 minutes to about 20 minutes under constant agitation. The parts are then immersed in a second tank containing hot deionized water at about 50° C., again with constant agitation so as to remove cleaning solvent carry-over and any residual organics, followed by a thorough rinse with deionized water and dried. Alternatively, after the first solvent cleaning step, the parts are subjected to a second solvent cleaning in a second bath, then first water rinse to remove organic solvent followed by a second thorough water rinse and finally the drying the parts. As stated earlier, instead of water rinse, a low boiling solvent such as IPA (2-propanol) can also be used instead of water to remove or wash off the higher boiling cleaning solvent adhering to the substrate surface to accelerate drying by blowing nitrogen. However, a water rinse is preferred according to this invention because of the safety and environmental issues associated with the use of volatile organic solvents. Removal of the residue can be accelerated by continuous solvent flow or spray under pressure or ultrasonic spray. After solvent cleaning and rinsing, the parts were dried at between about 90 to about 100° C. under $N_2$ and allowed to cool in an inert atmosphere. Surface analysis of cleaned surfaces by x-ray photoelectron spectroscopy (XPS) provided surface elemental composition on various surfaces which was compared with the corresponding surfaces prior to solvent cleaning and thus the degree of cleaning achieved by the semi-aqueous cleaning method described above. Based on the XPS analysis results, efficient and effective removal of flux residue from ceramic and solder surfaces is obtained.

The semi-aqueous solvent cleaning method of this invention uses high boiling essentially water soluble solvents which have no environmental regulatory or health hazard issues, and which do not require any high cost cleaning equipment. When using these solvents without adding water, the solvent can be easily recovered by distillation and reused providing the benefit of waste minimization. The intermediate water rinse used to remove the organic solvent from the module surface is preferably containerized for recovery or disposal after multiple rinses due to build-up of washed-off solvent, while the final rinse water can be drain discharged as it contains insignificant level of organic contaminants.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A cleaning method for removing flux residues formed on the surfaces of micro electronic components following a soldering operation using solder paste comprising the steps of:

supplying an electronic module having a flux residue deposit on various surfaces after a soldering operation;

providing a solvent cleaning composition consisting essentially of a propylene glycol mono alkyl ether represented by the formula $R^1O\,(AO)^xR^2$ wherein $R^1$ and $R^2$ are independently selected from the group consisting of hydrogen atoms, alkyl groups of the formula $C_nH_{2n+1}$ where n=1–4, A is a straight or branched propyl group, x is 1 to 3, with the proviso that one of $R^1$ or $R^2$ is other than hydrogen;

contacting the module with the cleaning composition at an elevated temperature for an effective time to soften, swell, dissolve, and remove or strip the flux residue deposit on the module surface; and rinsing the contacted substrate to remove the organic solvent carry-over.

2. The method of claim 1 wherein the micro electronic component is a ceramic chip carrier having silicon device chip(s), C4 decaps, SMTs, and a plastic ball grid array (PBGA), where the chip carrier has the flux residue from solder column attachment by solder reflow at about 210–220° C. peak temperature using a solder paste.

3. The method of claim 1 wherein x is 2.

4. The method of claim 1 wherein x is 3.

5. The method of claim 1 wherein the rinse uses deionized water at an elevated temperature.

6. The method of claim 5 wherein the rinsed substrate is subjected to another rinse.

* * * * *